US012578016B2

(12) United States Patent
Dufek et al.

(10) Patent No.: US 12,578,016 B2
(45) Date of Patent: Mar. 17, 2026

(54) COATED PISTON RING FOR AN INTERNAL COMBUSTION ENGINE

(71) Applicant: Federal-Mogul Powertrain LLC, Northville, MI (US)

(72) Inventors: Daniel J. Dufek, Mishicot, WI (US); Marc Irrgeher, Manitowoc, WI (US)

(73) Assignee: Federal-Mogul Powertrain LLC, Northville, MI (US)

( * ) Notice: Subject to any disclaimer, the term of this patent is extended or adjusted under 35 U.S.C. 154(b) by 0 days.

(21) Appl. No.: 17/318,530

(22) Filed: May 12, 2021

(65) Prior Publication Data

US 2022/0364643 A1    Nov. 17, 2022

(51) Int. Cl.
| | |
|---|---|
| *F16J 9/26* | (2006.01) |
| *C23C 14/06* | (2006.01) |
| *C23C 28/00* | (2006.01) |
| *C25D 3/04* | (2006.01) |
| *F16J 9/12* | (2006.01) |

(52) U.S. Cl.
CPC .............. *F16J 9/26* (2013.01); *C23C 14/0641* (2013.01); *C23C 28/34* (2013.01); *C25D 3/04* (2013.01); *F16J 9/12* (2013.01); *Y10T 428/12854* (2015.01)

(58) Field of Classification Search
CPC . F16J 9/26; F16J 9/12; C23C 14/0641; C25D 3/04; Y10T 428/12854; B32B 15/04
See application file for complete search history.

(56) References Cited

U.S. PATENT DOCUMENTS

| | | | | |
|---|---|---|---|---|
| 9,352,427 | B2 * | 5/2016 | Esser ......................... | C23C 8/80 |
| 9,551,419 | B2 * | 1/2017 | Kantola ..................... | F16J 9/26 |
| 2007/0128807 | A1 * | 6/2007 | Fischer ...................... | F16J 9/26 |
| | | | | 438/266 |
| 2010/0019458 | A1 | 1/2010 | Esser | |
| 2013/0241154 | A1 | 9/2013 | Shim | |
| 2013/0334773 | A1 | 12/2013 | Lu | |
| 2013/0334774 | A1 * | 12/2013 | Lu ........................... | F16J 9/062 |
| | | | | 277/440 |

(Continued)

FOREIGN PATENT DOCUMENTS

| | | |
|---|---|---|
| CN | 103836186 A | 6/2014 |
| DE | 102007007961 C5 | 8/2008 |

(Continued)

*Primary Examiner* — Adam Krupicka
(74) *Attorney, Agent, or Firm* — Dickinson Wright PLLC

(57) ABSTRACT

A coated piston ring for a piston is provided. The piston ring includes a running surface, a flank surface, and a transition surface therebetween. The transition surface curves or extends at an angle between the running surface and the flank surface. A running layer is disposed over the running surface and over at least a portion of the transition surface. A flank layer is disposed over the flank surface and over at least a portion of the transition surface. The running layer is applied by physical vapor deposition, and the running layer is applied by galvanic deposition. The running layer is formed of chromium nitride, and the flank layer is formed of chromium. A portion of the flank layer overlaps and is disposed outward of a portion of the running layer. During operation of the piston, the overlapping portion is spaced from both the piston and the cylinder.

15 Claims, 2 Drawing Sheets

(56)                    References Cited

U.S. PATENT DOCUMENTS

| | | | |
|---|---|---|---|
| 2015/0054222 A1* | 2/2015 | Herbst-Dederichs .... | C25D 7/04 |
| | | | 148/217 |
| 2015/0300492 A1* | 10/2015 | Mittler ...................... | F16J 9/20 |
| | | | 277/460 |
| 2016/0178054 A1 | 6/2016 | Tsuji | |
| 2016/0312891 A1 | 10/2016 | Aharonov | |
| 2017/0159816 A1 | 6/2017 | Bauer | |
| 2017/0254418 A1 | 9/2017 | Stong | |
| 2020/0309263 A1 | 10/2020 | Hoppe | |

FOREIGN PATENT DOCUMENTS

| | | | |
|---|---|---|---|
| EP | 3286353 | B1 | 6/2019 |
| WO | 2019105979 | A1 | 6/2019 |

* cited by examiner

2A

44

38

50

52

40

48

34

COATED PISTON RING FOR AN INTERNAL COMBUSTION ENGINE

BACKGROUND OF THE INVENTION

1. Field of the Invention

The present invention relates generally to a piston ring for providing a seal between the piston and a cylinder of the engine, an assembly including the piston ring between the piston and cylinder, and methods of manufacturing the same.

2. Related Art

Typical internal combustion engines are provided with at least one piston assembly which reciprocates within a cylinder of an engine block. In general, each piston assembly includes a piston body with a plurality of ring grooves, each of which typically receives and operably supports a piston ring. In operation, the piston rings remain in the ring grooves and travel with their respective piston bodies in a reciprocating motion within cylinders of an engine block. Among other things, the pistons rings function to seal combustion gasses in a combustion chamber above the piston body, to transfer heat from the piston body to the cylinder wall, to restrict the passage of oil from the crank case to the combustion chamber and to provide a generally uniform oil film on the cylinder wall. Piston rings are oftentimes coated to reduce wear and friction, and thus improve performance. Reduced manufacturing cost is also desired.

SUMMARY

One aspect of the present invention provides a piston ring for an engine. The piston comprises a body portion including a running surface, a flank surface, and a transition surface between the running surface and the flank surface. The running layer is disposed over the running surface and over at least a portion of the transition surface. The running layer is formed of chromium nitride. A flank layer is disposed over the flank surface and over at least a portion of the transition surface. The flank layer is formed of chromium. A portion of the flank layer and a portion of the running layer overlap one another.

Another aspect of the invention provides a piston assembly comprising a piston including a ring groove, and a piston ring is disposed in the ring groove of the piston. The piston ring includes a running surface, a flank surface, and a transition surface between the running surface and the flank surface. The piston ring includes a running layer disposed over the running surface and over at least a portion of the transition surface. The running layer is formed of chromium nitride. The piston ring also includes a flank layer disposed over the flank surface and over at least a portion of the transition surface. The flank layer is formed of chromium. A portion of the flank layer and a portion of the running layer overlap one another, and the overlapping portion of the flank layer and the running layer being spaced from the ring groove of the piston.

A method of manufacturing a piston ring is also provided. The piston ring comprises a body portion including a running surface, a flank surface, and a transition surface between the running surface and said flank surface. The method includes applying a running layer over the running surface and over at least a portion of the transition surface by a physical vapor deposition process; and applying a flank layer over the flank surface and over at least a portion of the transition surface by a galvanic deposition process such that a portion of the flank layer overlaps a portion of the running layer.

BRIEF DESCRIPTION OF THE DRAWINGS

These and other features and advantages of the present invention will be readily appreciated, as the same becomes better understood by reference to the following detailed description when considered in connection with the accompanying drawings wherein.

DETAILED DESCRIPTION OF THE EXAMPLE EMBODIMENTS

Figure 1:
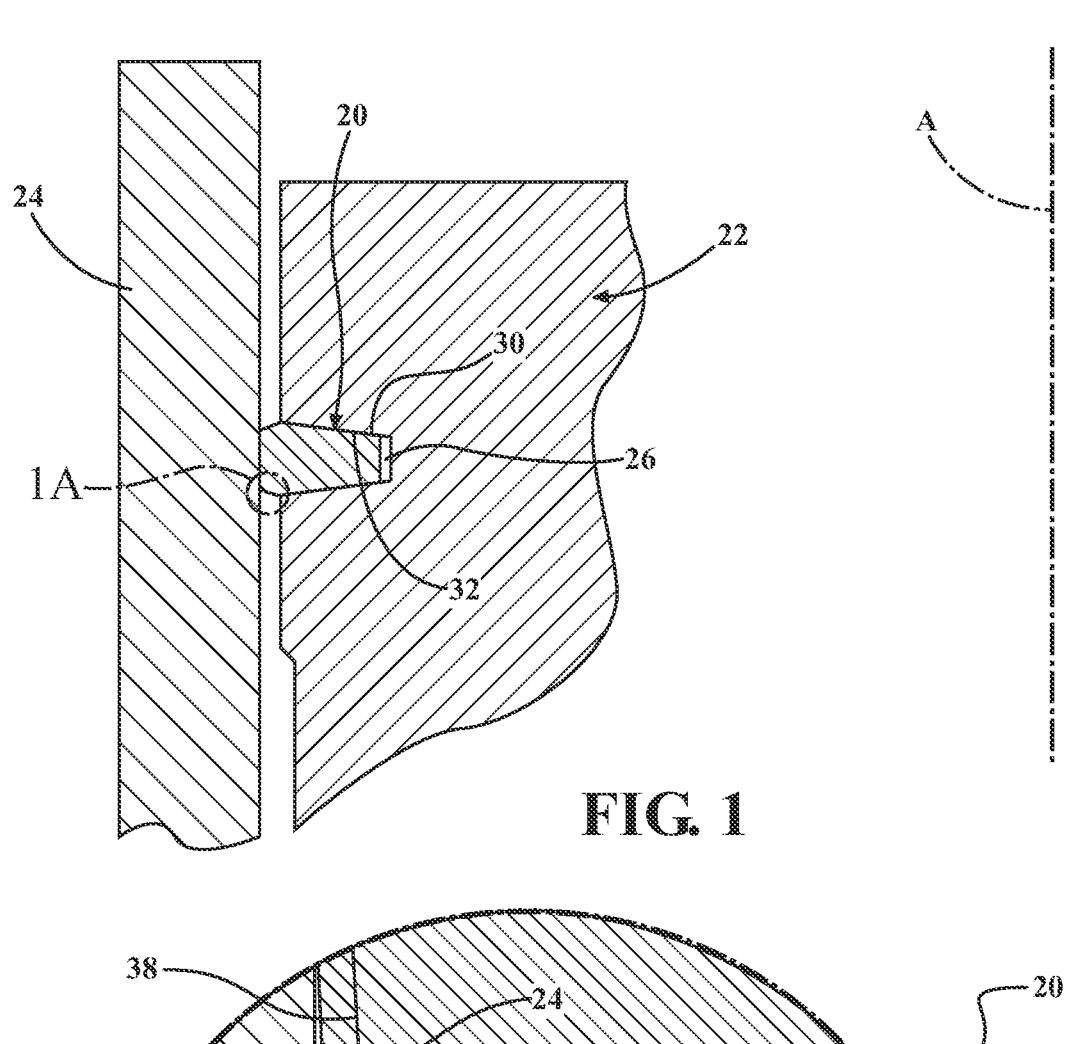
FIG. 1 is a side cross-sectional view of a portion of a piston which includes a coated piston ring and is disposed in a cylinder of an engine according to an exemplary embodiment.
Figure 2:
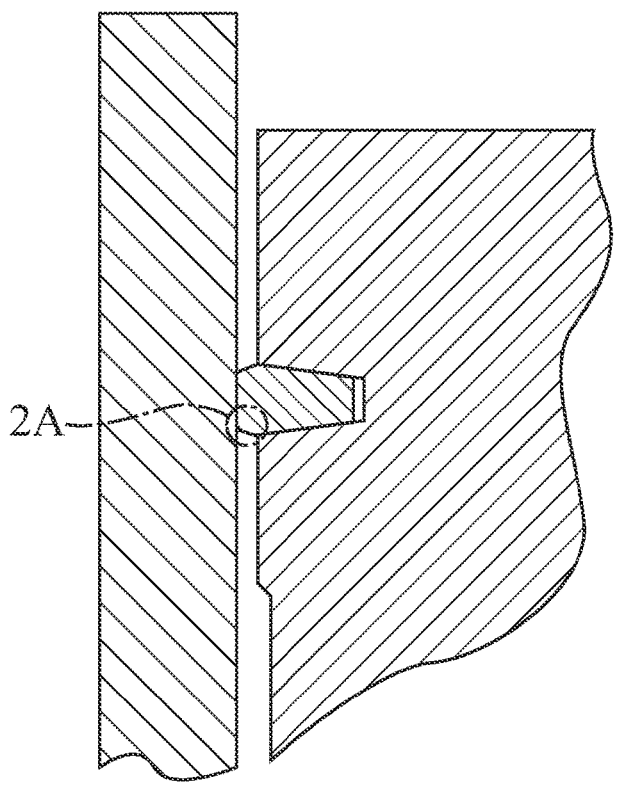
FIG. 2 is a side cross-sectional view of a portion of a piston which includes a coated piston ring and is disposed in a cylinder of an engine according to another exemplary embodiment.

One aspect of the invention provides a coated piston ring 20 designed for a piston 22 of an internal combustion engine. FIGS. 1 and 2 show a portion of the piston ring 20 disposed around the piston 22 and engaging a cylinder 24 of the internal combustion engine according to example embodiments. The piston ring 20 is disposed in a ring groove 26 of the piston 22 and provides a seal between the piston 22 and the cylinder 24.

As shown in the Figures, the piston ring 20 includes a body portion 28 formed of metal, and preferably an iron-based material. According to example embodiments, the iron-based material is cast iron or steel. The body portion 28 has a generally circular or oval shape and extends around a center axis A. The body portion 28 of the piston ring 20 includes an upper flank surface 30 for engaging an upper surface 32 of the ring groove 26, a lower flank surface 34 for engaging a lower surface 36 of the ring groove 26, and a running surface 38 for engaging the cylinder 24. The running surface 38 is typically parallel to the center axis A, and the upper and lower flank surfaces 30, 34 are typically transverse or generally perpendicular to the center axis A. For example, the transverse flank surfaces 30, 34 can extend at an angle relative to the center axis A, as shown in the FIGS. 1 and 2. The body portion 28 also preferably includes at least one transition surface 40 between the lower flank surface 34 and the running surface 38.

The body portion 28 of the piston ring 20 can have various different designs. In the example embodiment of FIG. 1, the body portion 28 includes the lower flank surface 34 extending generally parallel to the lower surface 36 of the ring groove 26, the upper flank surface 30 extending generally parallel to the upper surface 32 of the ring groove 26, and a single transition surface 40, wherein the majority of the transition surface 40 extends at an angle from the lower flank surface 34 toward the running surface 38. The body portion 28 includes a first sharp corner 42 between the transition surface 40 and the lower flank surface 34, and the transition surface 40 rounds as it approaches the running surface 38. In this case, the round portion of the transition surface 40 presents a convex shape. During operation of the piston 22 in the internal combustion engine, the transition surface 40 is spaced from both the cylinder 24 and the lower surface 36 of the ring groove 26. A portion of the lower flank surface 34 is also disposed outwardly of the ring groove 26.

In the example embodiment of FIG. 2, the body portion 28 includes the lower flank surface 34 extending generally parallel to the lower surface 36 of the ring groove 26, the upper flank surface 30 extending generally parallel to the upper surface 32 of the ring groove 26, and the transition surface 40, wherein the majority of the transition surface 40 extends at an angle from the lower flank surface 34 toward the running surface 38. According to this embodiment, the transition surface 40 rounds as it approaches both the lower flank surface 34 and the running surface 38. However, the transition surface 40 presents a concave shape as it approaches the lower flank surface 34, and a second sharp corner 44 is located between the transition surface 40 and the lower flank surface 34. The round portion of the transition surface 40 which approaches the running surface 38 presents a convex shape. During operation of the piston 22 in the internal combustion engine, the transition surface 40 is spaced from both the cylinder 24 and the lower surface 36 of the ring groove 26. A portion of the lower flank surface 34 is also disposed outwardly of the ring groove 26.

Figure 3:
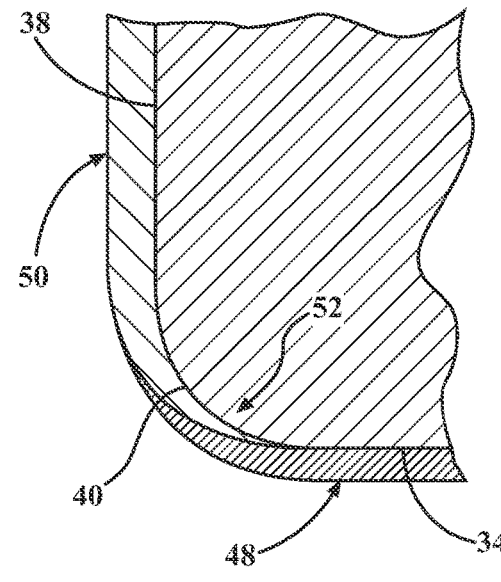
FIG. 3 is an enlarged side cross-sectional view of a portion of a coated piston ring according to a third exemplary embodiment.

In the example embodiment of FIG. 3, the body portion 28 includes the lower flank surface 34 extending generally parallel to the lower surface 36 of the ring groove 26, the upper flank surface 30 extending generally parallel to the upper surface 32 of the ring groove 26, and the transition surface 40, wherein the majority of the transition surface 40 curves from the lower flank surface 34 to the running surface 38. In this case, the round transition surface 40 presents a convex shape. During operation of the piston 22 in the internal combustion engine, the transition surface 40 is spaced from both the cylinder 24 and the lower surface 36 of the ring groove 26.

Figure 1A:
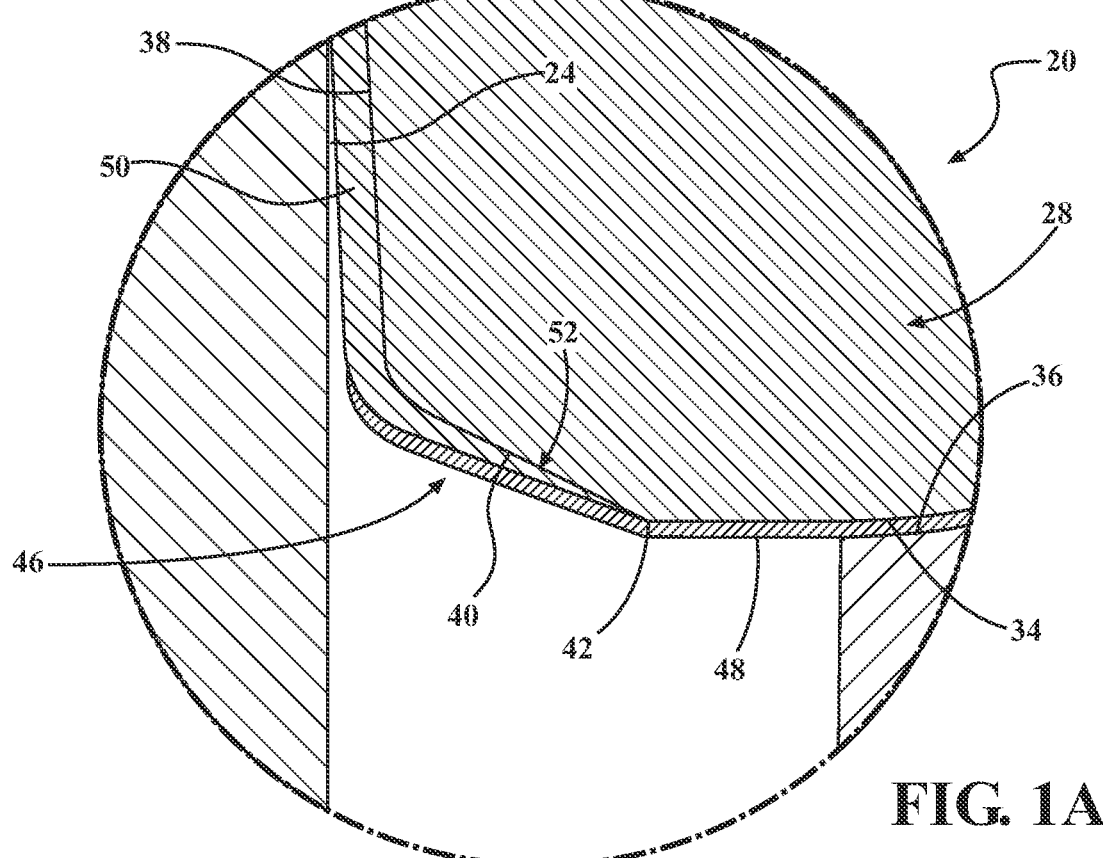
FIG. 1A is an enlarged view of a portion of FIG. 1 along line A-A.
Figure 2A:
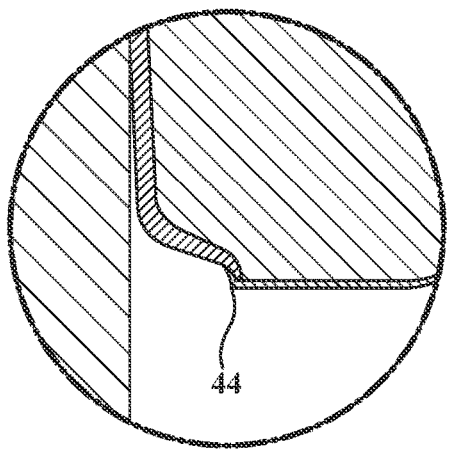
FIG. 2A is an enlarged view of a portion of FIG. 2 along line A-A.

As best shown in FIGS. 1A, 2A, and 3, a coating 46 is applied to the body portion 28 of the piston ring 20 to reduce wear and friction, and thus improve performance of the piston 22 in the internal combustion engine. The coating 46 includes at least two layers 48, 50, including a flank layer 48 disposed over the lower flank surface 34 of the piston ring 20 and a running layer 50 disposed over the running surface 38 of the piston ring 20. The flank layer 48 and the running layer 50 both provide an outermost surface of the coating 46 and also an outermost surface of the piston ring 20. According to one embodiment, the flank layer 48 is disposed directly on the lower flank surface 34 and the running layer 50 is disposed directly on the running surface 38. However, the coating 46 can optionally include one or more additional layers beneath the flank layer 48 and/or the running layer 50.

According to the exemplary embodiments, the running layer 50 is formed of chromium nitride. The running layer 50 is applied on the running surface 38, or applied to another layer disposed on the running surface 38, by physical vapor deposition (PVD). As shown in the Figures, the running layer 50 is also applied to at least a portion of the transition surface 40. In the embodiment of FIGS. 1 and 1A, the running layer 50 is applied to the running surface 38 and a portion of the transition surface 40. In the embodiment of FIGS. 2 and 2A, the running layer 50 is applied to the running surface 38 and the entire transition surface 40. In the embodiment of FIG. 3, the running layer 50 is applied to the running surface 38 and the entire transition surface 40.

According to the exemplary embodiments, the flank layer 48 is formed of chromium. The flank layer 48 is applied to the lower flank surface 34, or applied to another layer disposed on the lower flank surface 34, preferably by an economical process, such as galvanic deposition. As shown in the Figures, the flank layer 48 can be applied to a portion of the transition surface 40. The flank layer 48 is also applied to a portion of the running layer 50 located on or over the transition surface 40. In the embodiment of FIGS. 1 and 1A, the flank layer 48 is applied to the lower flank surface 34 and a portion of the running layer 50. According to this embodiment, the flank layer 48 is applied over the entire transition surface 40 and may be applied over a very small portion of the running surface 50. In the embodiment of FIGS. 2 and 2A, the flank layer 48 is applied to the lower flank surface 34 and a small portion of the running layer 50. According to this embodiment, the flank layer 48 is applied over a small portion of the transition surface 40. In the embodiment of FIG. 3, the flank layer 48 is applied to the lower flank surface 34 and a portion of the running layer 50. According to this embodiment, the flank layer 48 is applied over a majority of the transition surface 40.

As shown in the Figures, a portion of the flank layer 48 overlaps the running layer 50 which is formed by PVD, and the flank layer 48 is preferably disposed outward of the running layer 50. As previously discussed an overlapping portion 52 of the flank layer 48 and the running layer 50 is located along the transition surface 40 of the body portion 28 of the piston ring 20. Preferably, no additional layers are disposed outward of the running layer 50 or the flank layer 48.

According to example embodiments, the piston ring 20 also includes the transition surface 40 between the upper flank surface 30 and the running surface 50. Thus, the piston ring 20 can include the flank layer 48 on the upper flank surface 30 instead of, or in addition to, on the lower flank surface 34. For example, as shown in FIGS. 1 and 2, the upper and lower halves of the piston ring 20 can be mirror images of one another. Alternatively, the piston ring 20 can be flipped so that the lower flank surface 34 is at the top of the piston ring 20.

During operation of the engine, the coated piston ring 20 is disposed in the ring groove 26 of the piston 22 and slides along the cylinder 24. A majority of the running layer 50 engages the cylinder 24 during operation, and a majority of the flank layer 48 engages the lower surface 36 of the ring groove 26 during operation. A small portion of the running surface 38 and a small portion of the running layer 50 may be spaced from the cylinder 24, as shown in FIGS. 1A and 2A. Typically, a portion of the lower flank surface 34 and a portion of the flank layer 48 is located outward of the lower surface 36 of the ring groove 26. The overlapping portion 52 of the flank layer 48 and the running layer 50 is preferably located outward of the lower surface 36 of the ring groove 26 and is spaced from the cylinder 24 during operation. Alternatively, a majority of the overlapping portion 52 of the flank layer 48 and the running layer 50 is preferably located outward of the lower surface 36 of the ring groove 26 and is spaced from the cylinder 24 during operation. Thus, the overlapping portion 52 does not engage the cylinder 24 or ring groove 26 and thus is not subject to significant wear and friction during operation.

It has been observed that the coating 46 experiences less friction and exhibits less wear after use in an engine relative to comparative piston rings. The cost to manufacture the coated piston ring 20 is also typically lower than comparative costed piston rings due to the PVD and galvanic methods used to apply the running layer 50 and the flank layer 48. More specifically, the running layer 50 experiences low friction and exits low wear and is also resistant to bore scoring. The flank layer 48 is applied cost effectively and experiences less friction and wear relative to comparative coated piston rings, such as nitride rings.

Many modifications and variations of the present invention are possible in light of the above teachings and may be practiced otherwise than as specifically described while within the scope of the claims. It is also contemplated that all features of all claims and of all embodiments can be combined with each other, so long as such combinations would not contradict one another.

What is claimed is:

1. A piston ring, comprising:
   a body portion surrounding a center axis, said body portion including a running surface, a flank surface, and a transition surface between said running surface and said flank surface, said transition surface extending inwardly toward said center axis and at an angle between said running surface and said flank surface, wherein said transition surface includes a convex portion proximate said running surface;
   a running layer disposed over said running surface and over at least a portion of said transition surface, said running layer being formed of chromium nitride;
   a flank layer disposed over said flank surface and over at least a portion of said transition surface, said flank layer being formed of chromium; and
   a portion of said flank layer which is disposed over said transition surface being disposed on a portion of said running layer.

2. The piston ring of claim 1, wherein said portion of said flank layer is disposed outward of said running layer.

3. The piston ring of claim 1, wherein said running layer is applied by physical vapor deposition.

4. The piston of claim 1, wherein said flank layer is applied by galvanic deposition.

5. The piston of claim 1, wherein said running layer and said flank layer provide outermost surfaces of said piston ring.

6. The piston ring of claim 1, wherein said body portion is formed of an iron-based material, said running surface is parallel to said center axis, and said flank surface is transverse to said center axis.

7. The piston ring of claim 1, wherein a majority of said transition surface extends at said angle and straight from said flank surface toward said running surface, said body portion includes a first sharp corner between said straight majority of said transition surface and said flank surface, and said convex portion extend s from said straight majority of said transition surface to said running surface.

8. The piston ring of claim 7, wherein said running layer is disposed on a portion of said transition surface, and said flank layer is disposed on a portion of said running layer and over an entirety of said transition surface.

9. The piston ring of claim 1, wherein a majority of said transition surface is disposed at said angle and straight between said flank surface and said running surface, said transition surface has a concave portion as it transitions from said straight majority of said transition surface toward said flank surface, said body portion includes a first sharp corner between said concave portion of said transition surface and said flank surface, said transition surface presents the convex portion as it transitions from said straight majority of said transition surface to said running surface.

10. The piston ring of claim 9, wherein said running layer is disposed on an entirety of said transition surface, said flank layer is disposed on a portion of said running layer and over a portion of said transition surface.

11. The piston ring of claim 1, wherein said running layer is disposed on an entirety of said transition surface, said flank layer is disposed on a portion of said running layer and over a portion of said transition surface.

12. A piston assembly, comprising:
   a piston including a ring groove;
   a piston ring disposed in said ring groove of said piston;
   said piston ring including a body portion surrounding a center axis, said body portion including a running surface facing away from said ring groove of said piston, a flank surface, and a transition surface between said running surface and said flank surface, said transition surface extending inwardly toward said center axis and at an angle between said running surface and said flank surface, wherein said transition surface includes a convex portion proximate said running surface;
   said piston ring including a running layer disposed over said running surface and over at least a portion of said transition surface, said running layer being formed of chromium nitride;
   said piston ring including a flank layer disposed over said flank surface and over at least a portion of said transition surface, said flank layer being formed of chromium;
   a portion of said flank layer which is disposed over said transition surface being disposed on a portion of said running layer; and
   said portion of said flank layer which is disposed on said running layer being spaced from said ring groove of said piston.

13. The piston assembly of claim 12, wherein said piston is disposed in a cylinder; and said portion of said flank layer which is disposed on said running layer is spaced from said cylinder.

14. The piston assembly of claim 12, wherein said portion of said flank layer which is disposed on said running layer is disposed outward of said running layer.

15. The piston assembly of claim 12, wherein said running layer and said flank layer provide outermost surfaces of said piston ring.

* * * * *